United States Patent
Tetsu (10) Patent No.: US 9,832,908 B2
(45) Date of Patent: Nov. 28, 2017

(54) ELECTRONIC APPARATUS

(71) Applicant: SONY COMPUTER ENTERTAINMENT INC., Tokyo (JP)

(72) Inventor: Sumii Tetsu, Tokyo (JP)

(73) Assignee: SONY INTERACTIVE ENTERTAINMENT INC., Tokyo (JP)

( * ) Notice: Subject to any disclaimer, the term of this patent is extended or adjusted under 35 U.S.C. 154(b) by 0 days.

(21) Appl. No.: 14/891,677

(22) PCT Filed: May 7, 2014

(86) PCT No.: PCT/JP2014/062250
§ 371 (c)(1),
(2) Date: Nov. 17, 2015

(87) PCT Pub. No.: WO2014/185310
PCT Pub. Date: Nov. 20, 2014

(65) Prior Publication Data
US 2016/0120061 A1    Apr. 28, 2016

(30) Foreign Application Priority Data

May 17, 2013   (JP) ................................. 2013-105607

(51) Int. Cl.
*H05K 7/20*      (2006.01)
*H05K 5/02*      (2006.01)
(Continued)

(52) U.S. Cl.
CPC ......... *H05K 7/20136* (2013.01); *G06F 1/181* (2013.01); *G06F 1/20* (2013.01);
(Continued)

(58) Field of Classification Search
CPC .......... G06F 1/1601; G06F 1/181; G06F 1/20; H05K 5/0004; H05K 5/0247; H05K 7/20136; H05K 7/20181
See application file for complete search history.

(56) References Cited

U.S. PATENT DOCUMENTS 5,546,273 A * 8/1996 Harris ..................... B60R 11/02
                                                          361/697
6,538,886 B2 * 3/2003 Yu ............................. G06F 1/20
                                                          165/122
(Continued)

FOREIGN PATENT DOCUMENTS

EP         0607879 A1    7/1994
JP         H06-188581 A  7/1994
(Continued)

OTHER PUBLICATIONS

Kawada, Masaaki, Information Recording and Reproducing Device, Translation date:Oct. 31, 2016, Global Dossier translation site.*

(Continued)

*Primary Examiner* — James Wu
*Assistant Examiner* — Michael Matey
(74) *Attorney, Agent, or Firm* — Hubbs, Enatsky & Inoue PLLC (57) ABSTRACT

A plurality of vent perforations are formed on a side face of an electronic apparatus and communicate the inside and the outside of the electronic apparatus with each other therethrough. The electronic apparatus includes a fan which sucks or discharges air through the plurality of vent perforations. A groove is formed on the side face of the electronic apparatus and extends in a forward and rearward direction. The plurality of vent holes are formed on an inner face of the groove of the side face. With the structure, the vent holes can be suppressed from being closed up when the electronic (Continued)

apparatus is placed vertically, and the drop of the ventilation efficiency can be suppressed.

15 Claims, 10 Drawing Sheets

(51) Int. Cl.
*H05K 5/00* (2006.01)
*G06F 1/20* (2006.01)
*G06F 1/18* (2006.01)

(52) U.S. Cl.
CPC ......... *H05K 5/0004* (2013.01); *H05K 5/0247* (2013.01); *H05K 7/20181* (2013.01)

(56) References Cited

U.S. PATENT DOCUMENTS

| | | | | |
|---|---|---|---|---|
| 6,580,605 | B1 * | 6/2003 | Kutaragi | H05K 7/1418 312/223.2 |
| 6,914,779 | B2 * | 7/2005 | Askeland | G06F 1/182 257/E23.099 |
| 7,755,896 | B2 | 7/2010 | Tamaki et al. | |
| 8,009,426 | B2 * | 8/2011 | Ahmad-Taylor | H05K 7/20127 174/547 |
| 2003/0174288 | A1 * | 9/2003 | Nakano | G03B 21/005 353/31 |
| 2003/0202325 | A1 * | 10/2003 | Sasaki | G06F 1/206 361/679.48 |
| 2009/0148638 | A1 | 6/2009 | Kishi et al. | |
| 2014/0362529 | A1 * | 12/2014 | Tsuchida | H05K 7/20181 361/690 |
| 2014/0364047 | A1 * | 12/2014 | Inoue | H05K 7/20009 454/184 |

FOREIGN PATENT DOCUMENTS

| | | | |
|---|---|---|---|
| JP | H06-314139 | A | 11/1994 |
| JP | H07-84673 | A | 3/1995 |
| JP | H10-270879 | A | 10/1998 |
| JP | H10-307637 | A | 11/1998 |
| JP | 2002-185157 | A | 6/2002 |
| JP | 2008-010769 | A | 1/2008 |
| JP | 2008010769 | A * | 1/2008 |
| JP | 2009-141160 | A | 6/2009 |
| JP | 2012-064897 | A | 3/2012 |
| JP | 2012-069685 | A | 4/2012 |
| JP | 2012-243961 | A | 12/2012 |

OTHER PUBLICATIONS

English Translation of International Search Report for corresponding PCT/JP2014/062250 dated Jul. 29, 2014.
English Translation of International Search Report for relating PCT/JP2014/062251 dated Jul. 22, 2014.
English Translation of Written Opinion of the International Searching Authority for PCT/JP2014/062250 accompanied with PCT/IB/373 and PCT/IB/338 dated Nov. 26, 2015, acting as concise explanation of previously submitted reference(s).
English Translation of the International Preliminary Report on Patentablity for PCT/JP2014/062251 accompanied with PCT/IB/338 dated Nov. 26, 2015, acting as concise explanation of previously submitted reference(s).
Partial supplementaly EP Search Report of Feb. 1, 2017 for corresponding EP Patent Application No. 14797639.3.
Office Action dated Sep. 27, 2016 for corresponding JP application No. 2015-517040 and Partial Translation thereof.
Search Report for corresponding EP Patent Application No. 14797356.4, dated Jan. 30, 2017.
Office Action dated Jan. 10, 2017 for corresponding JP application No. 2015-517040 and Partial Translation thereof.

* cited by examiner

ELECTRONIC APPARATUS

CROSS REFERENCE TO RELATED APPLICATIONS

This application is a National Stage of International Application No. PCT/JP2014/062250 filed on May 7, 2014, which claims priority to Japanese Patent Application No. 2013-105607 filed on May 17, 2013. The contents of each of the above documents are incorporated herein by reference in their entirety.

TECHNICAL FIELD

The present invention relates to an electronic apparatus which can be laid both vertically and horizontally.

BACKGROUND ART

Conventionally, electronic apparatus which function as a game machine or an audio-visual apparatus are utilized. In some of electronic apparatus of the type described, external air is sucked by driving a cooling fan and is utilized to cool a microprocessor such as a CPU or a GPU (for example, U.S. Pat. No. 7,755,896). In an electronic apparatus which includes a built-in cooling fan, a vent hole for sucking or discharging air therethrough is formed.

SUMMARY

In U.S. Pat. No. 7,755,896, a vent hole is provided on a side face of an electronic apparatus. However, in some electronic apparatus, both of a horizontal placement in which the bottom face is positioned on the lower side and a vertical placement in which a side face is positioned on the lower side are supposed as manners of placement in use. In such an electronic apparatus as just described, when the electronic apparatus is placed vertically, the vent hole is closed up and therefore the ventilation efficiency of the vent hole formed in the side wall drops.

The electronic apparatus disclosed herein includes a plurality of vent perforations provided on a side face of the electronic apparatus and configured to communicate the inside and the outside of the electronic apparatus with each other therethrough, a fan configured to suck or discharge air through the plurality of vent perforations, and a first groove formed on the side face and extending in a forward and rearward direction. The plurality of vent holes are formed on an inner face of the first groove of the side face. With the electronic apparatus, since the vent holes can be suppressed from being closed up when the electronic apparatus is placed vertically, the drop of the ventilation efficiency can be suppressed.

DESCRIPTION OF EMBODIMENT

Figure 1:
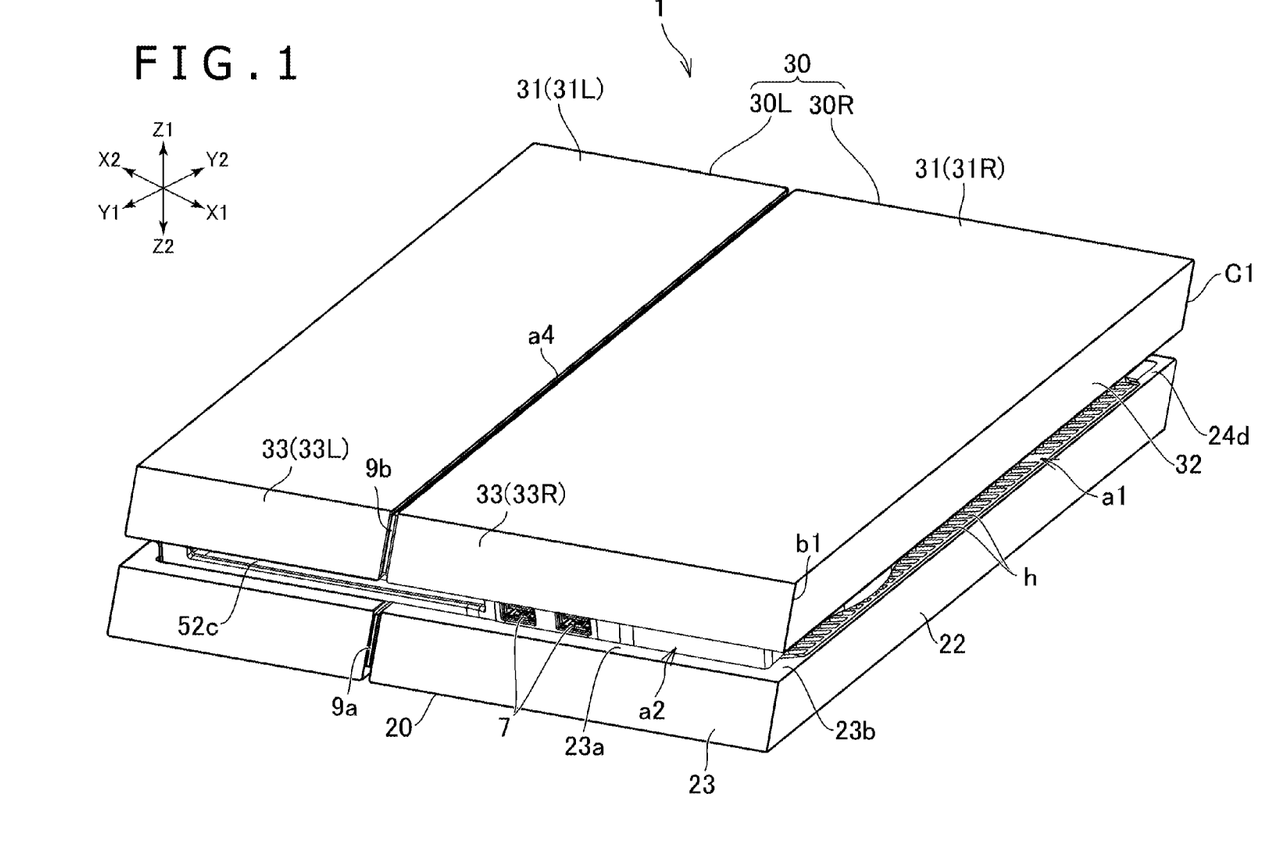
FIG. 1 is a perspective view depicting an upper face of an electronic apparatus according to an embodiment of the present invention as viewed from the front side.
Figure 2:
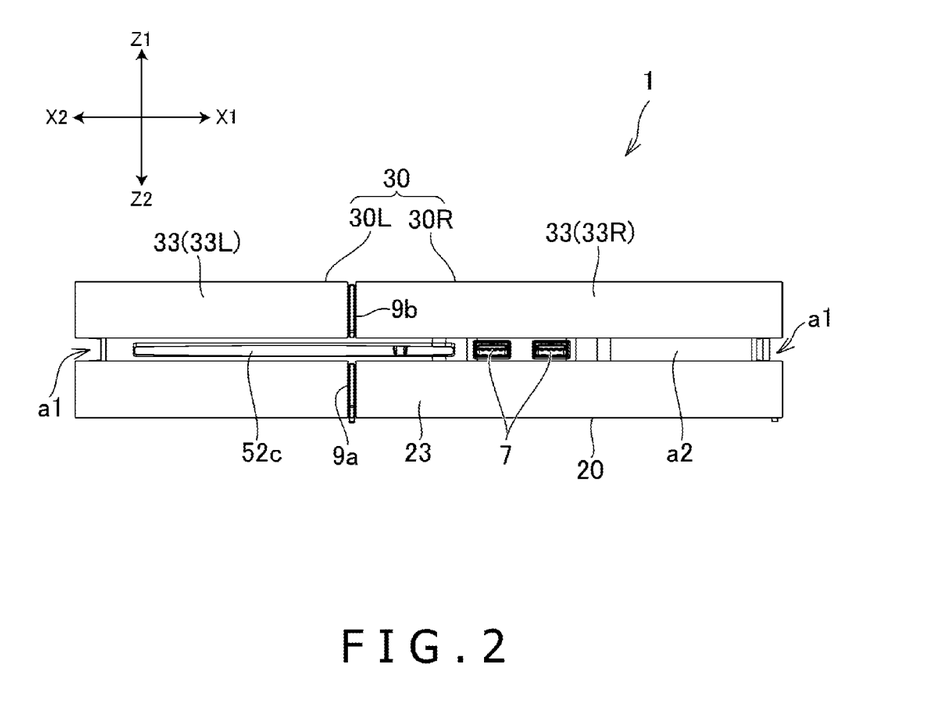
FIG. 2 is a front elevational view of the electronic apparatus.
Figure 3:
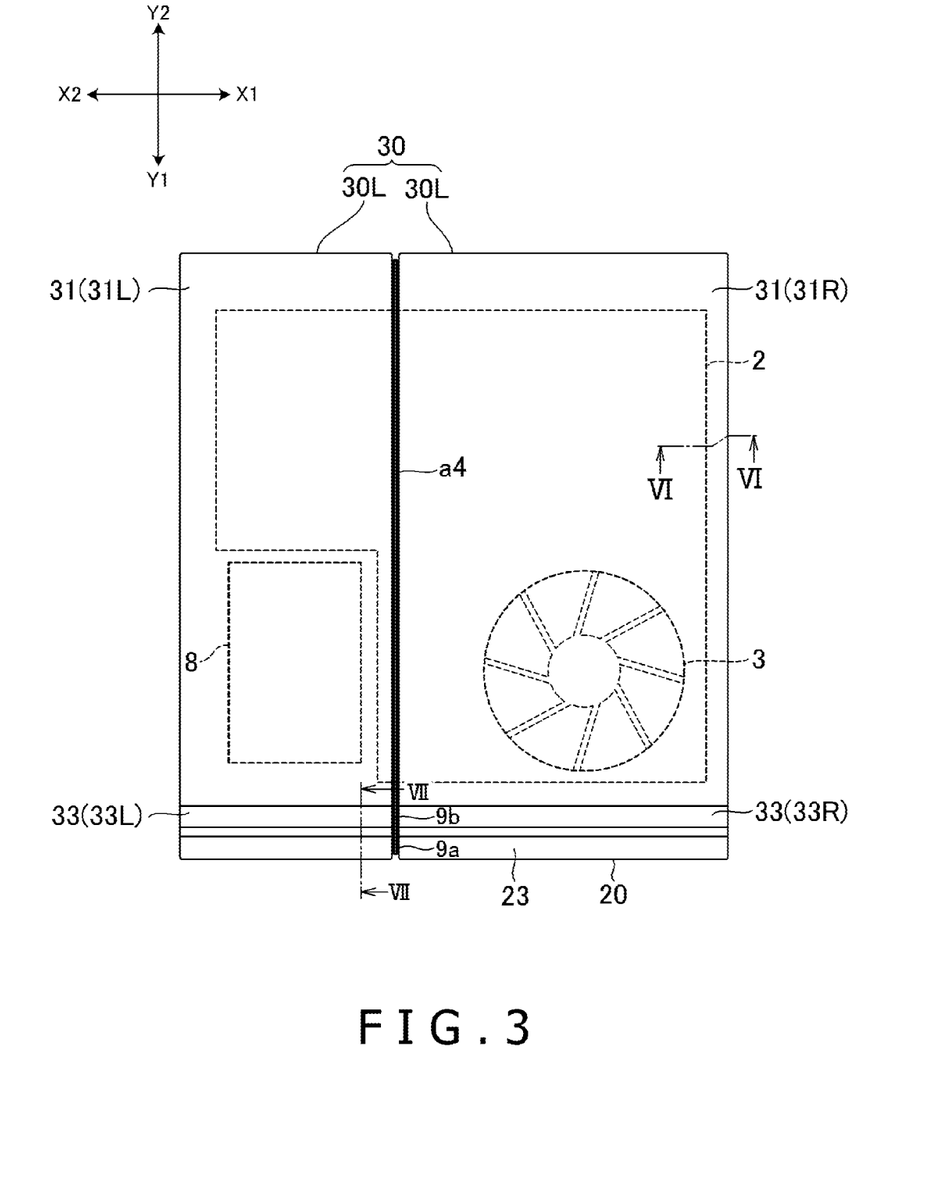
FIG. 3 is a top plan view of the electronic apparatus.
Figure 4:
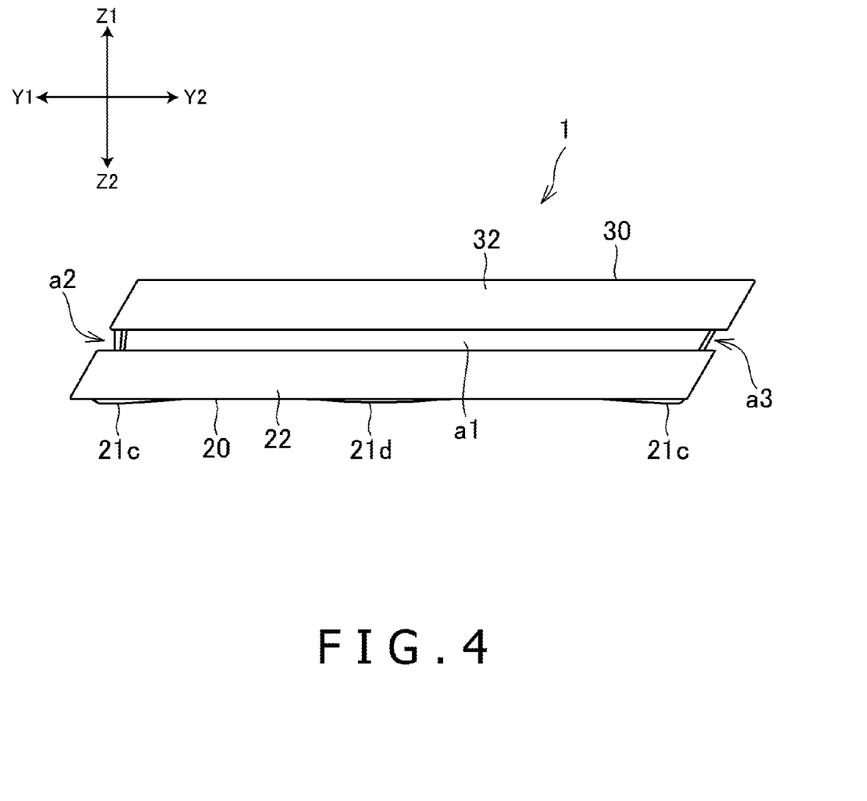
FIG. 4 is a side elevational view of the electronic apparatus.
Figure 5:
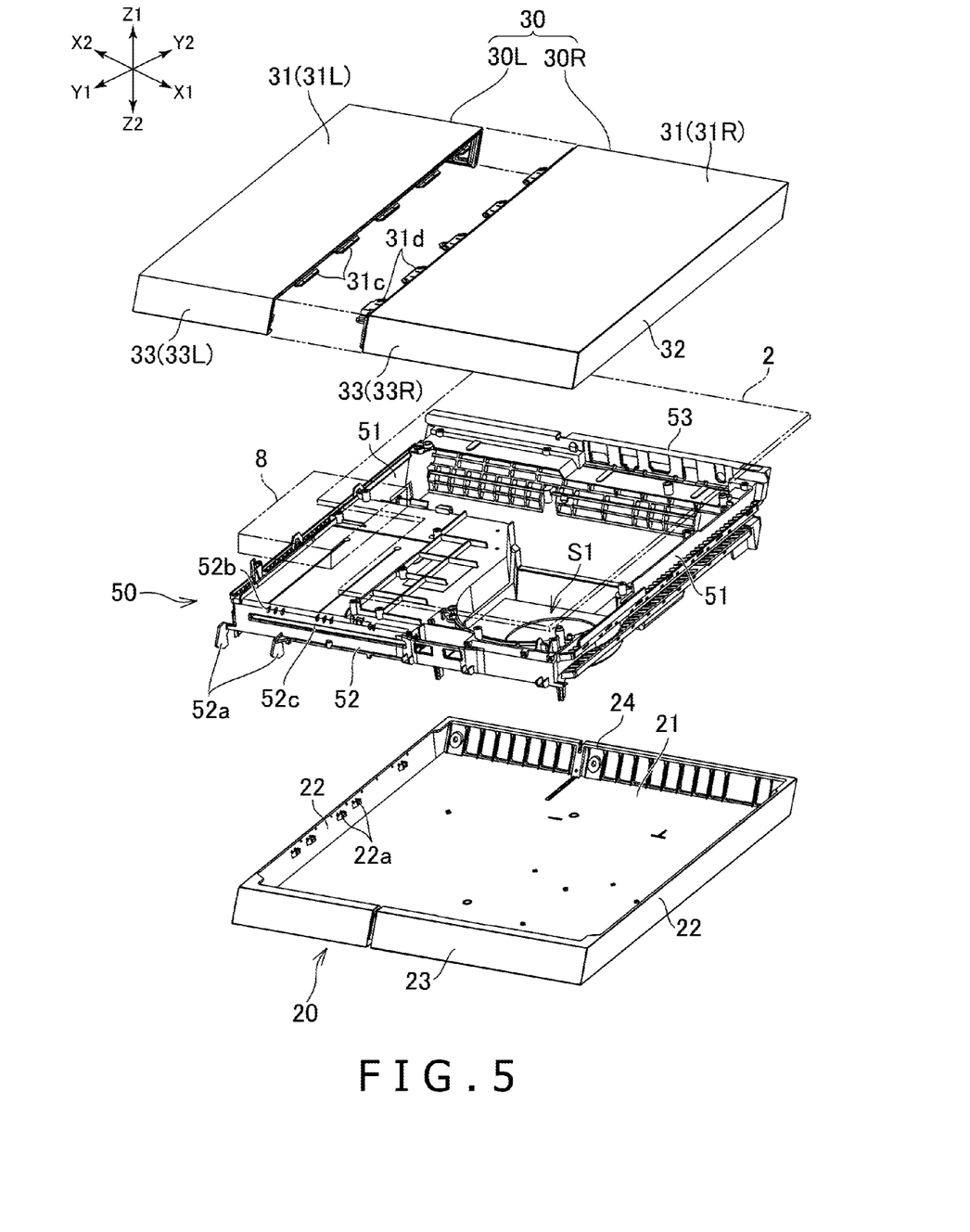
FIG. 5 is an exploded perspective view of a lower cover, an upper cover and a frame provided in the electronic apparatus.
Figure 6:
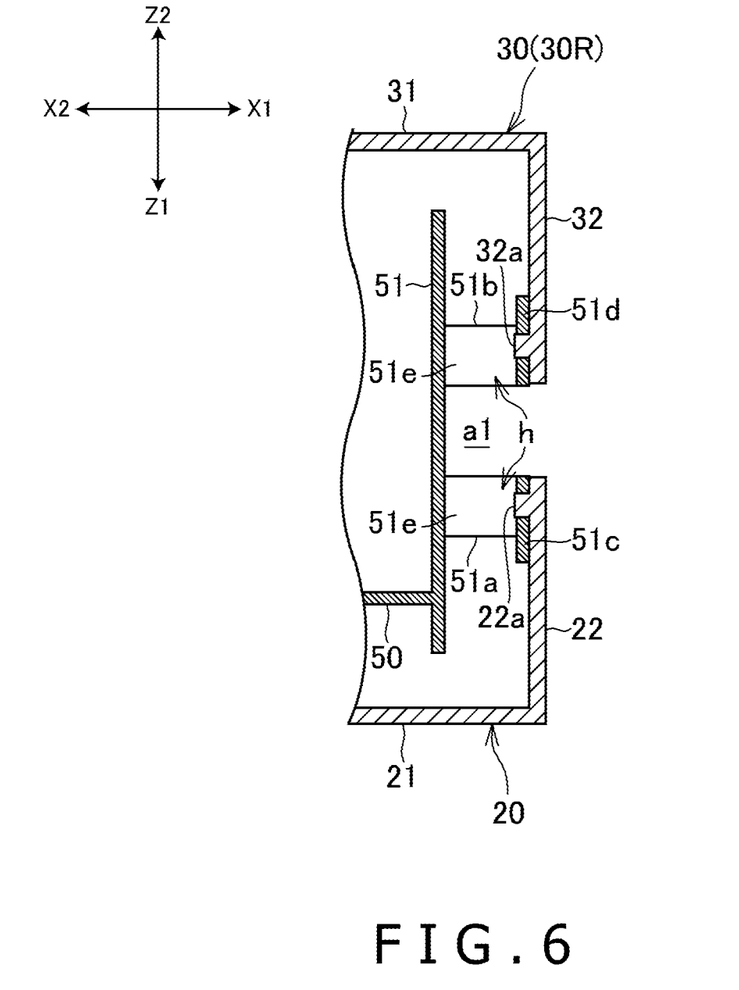
FIG. 6 is a sectional view taken along line VI-VI depicted in FIG. 3.
Figure 7:
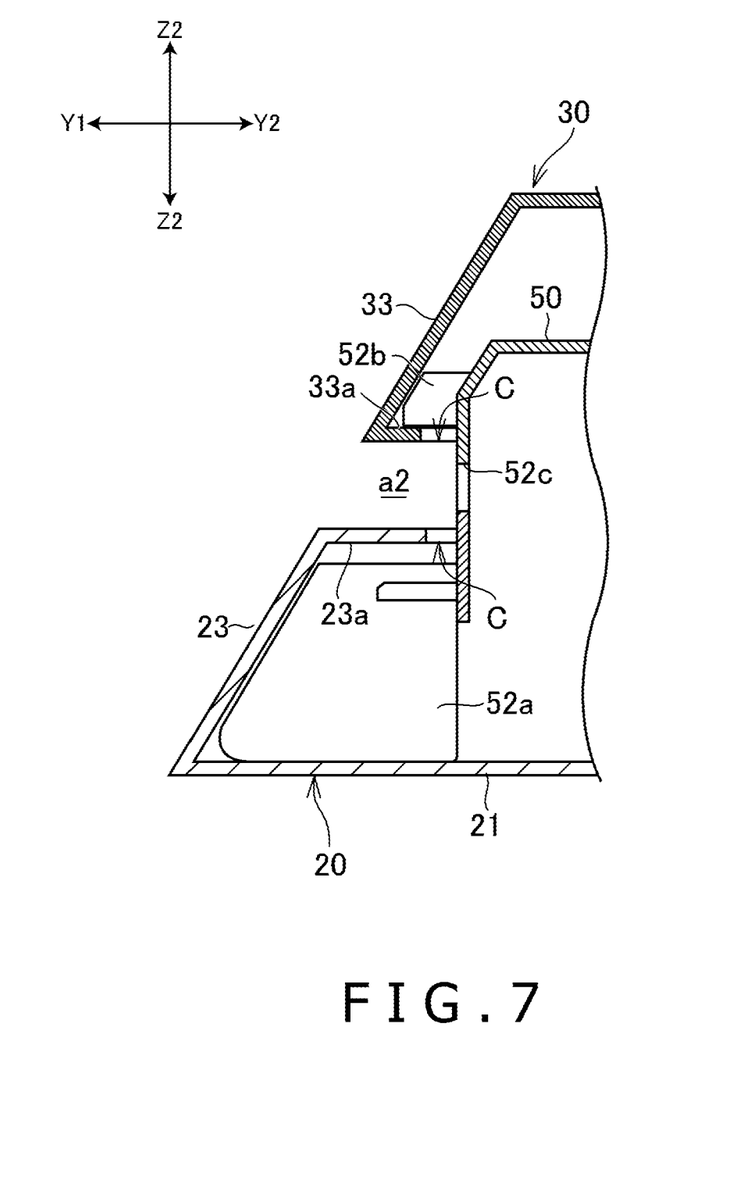
FIG. 7 is a sectional view taken along line VII-VII depicted in FIG. 3.
Figure 8:
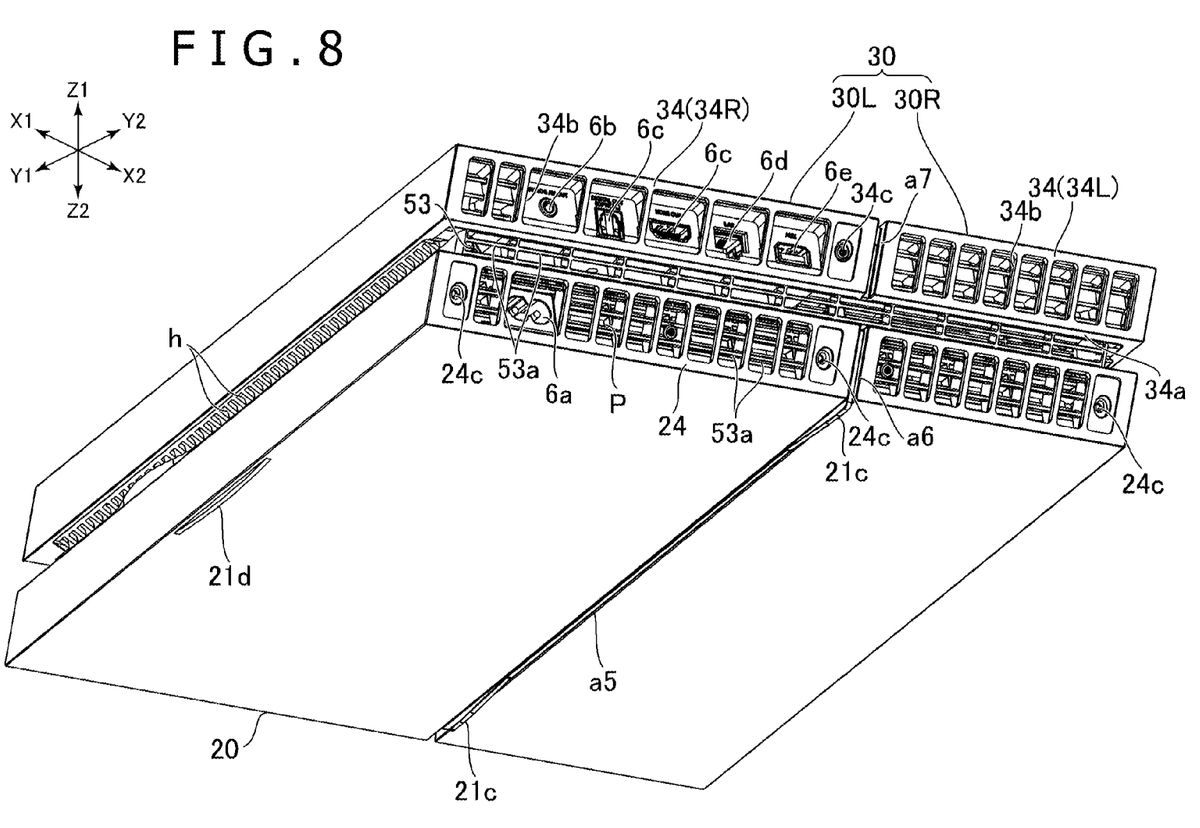
FIG. 8 is a perspective view depicting a bottom face of the electronic apparatus as viewed from the rear side.
Figure 9:
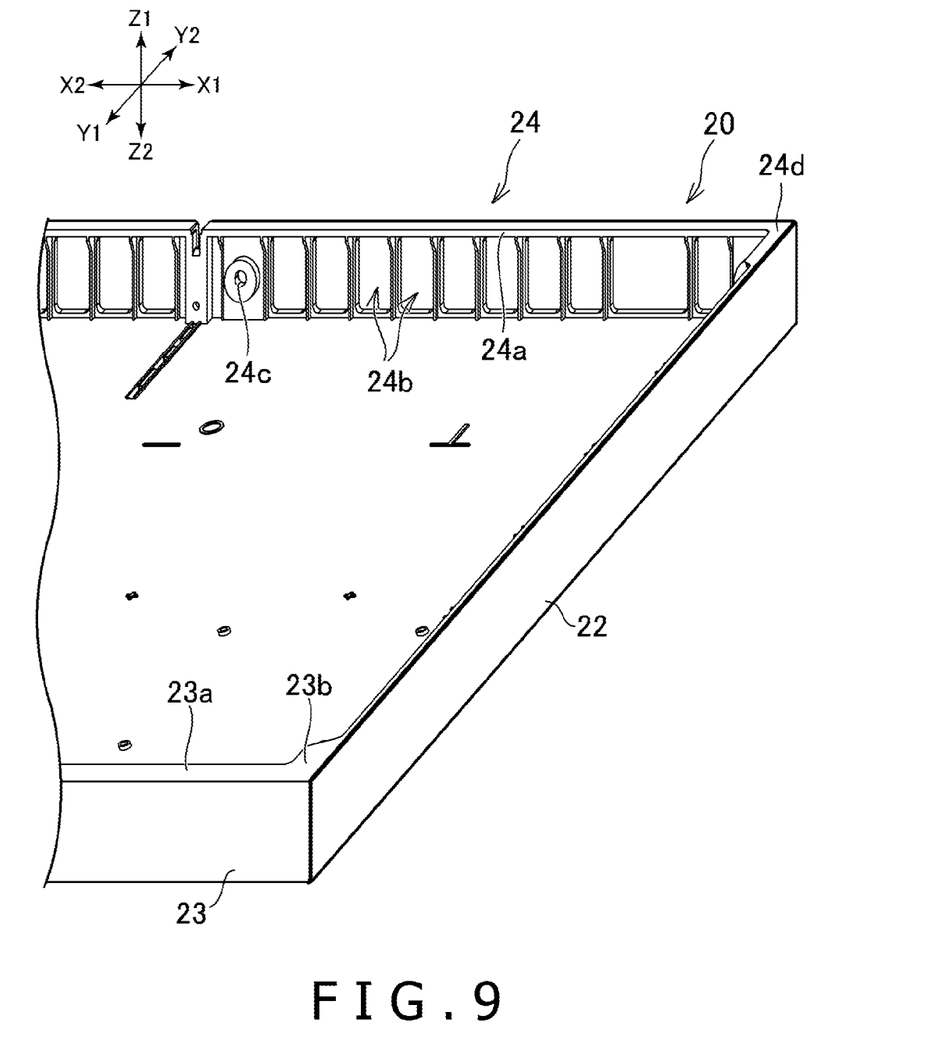
FIG. 9 is a perspective view of the lower cover.
Figure 10:
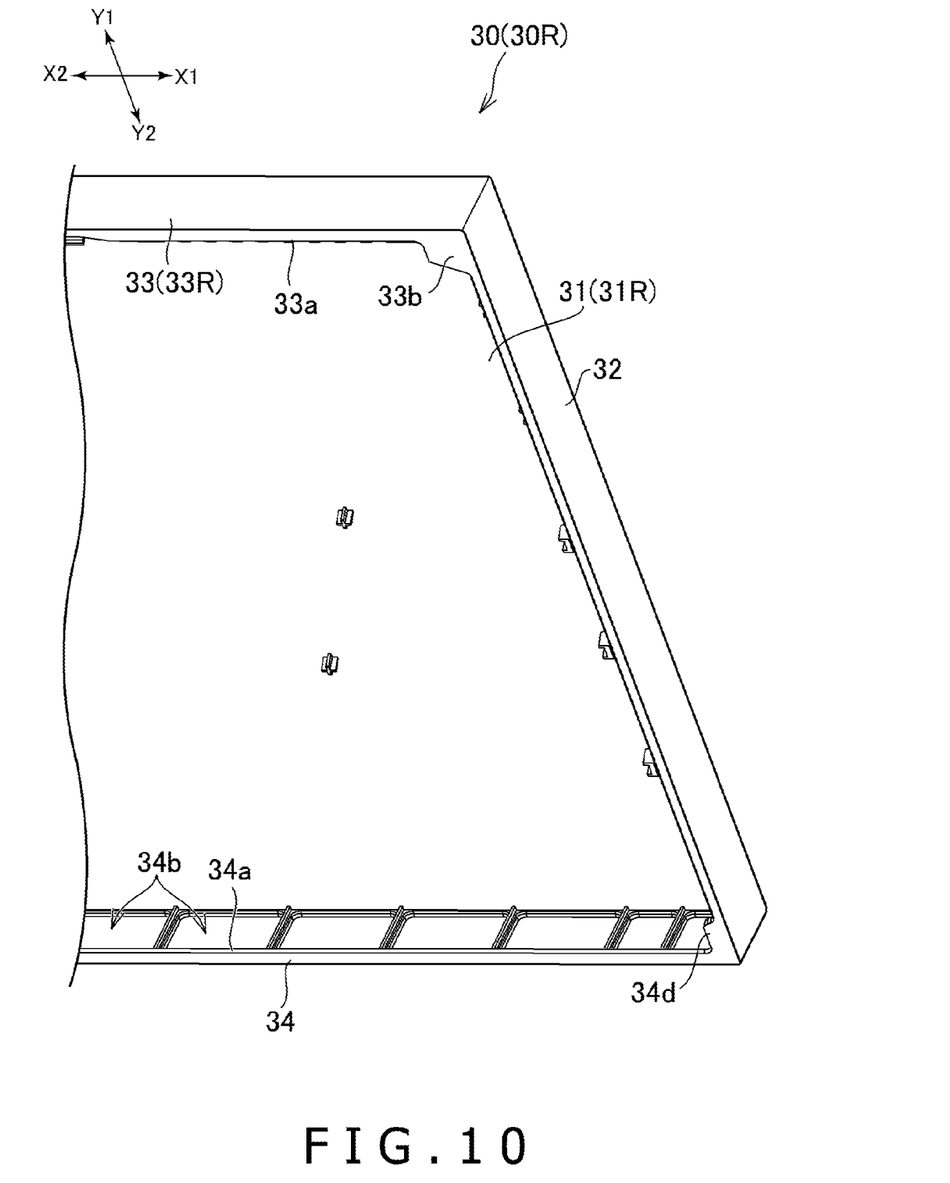
FIG. 10 is a perspective view depicting the inner side of the upper cover.

In the following, an embodiment of the present invention is described with reference to the drawings. FIG. 1 is a perspective view depicting an upper face of an electronic apparatus 1 according to the embodiment of the present invention as viewed from the front side. FIG. 2 is a front elevational view of the electronic apparatus 1; FIG. 3 is a top plan view; and FIG. 4 is a side elevational view. FIG. 5 is an exploded perspective view of a lower cover 20, an upper cover 30 and a frame 50 provided in the electronic apparatus 1. FIG. 6 is a sectional view taken along line VI-VI depicted in FIG. 3, and FIG. 7 is a sectional view taken along line VII-VII depicted in FIG. 3. FIG. 8 is a perspective view depicting a bottom face of the electronic apparatus as viewed from the rear side. FIG. 9 is a perspective view of the lower cover 20. FIG. 10 is a perspective view depicting the inner side of the upper cover 30. In the following description, reference symbols Y1 and Y2 depicted in FIG. 1 represent a forward direction and a rearward direction, respectively. X1 and X2 represent a rightward direction and a leftward direction, respectively. Z1 and Z2 represent an upward direction and a downward direction, respectively.

The electronic apparatus 1 is an entertainment apparatus which functions as a game apparatus or an audio-visual apparatus. The electronic apparatus 1 acquires a game program or video-audio data from a recording medium such as, for example, an optical disk. The electronic apparatus 1 has a wire communication function and/or a wireless communication function. Accordingly, in the different example, the electronic apparatus 1 makes use of the communication function to acquire a game program or video-audio data. The electronic apparatus 1 outputs moving picture data generated by execution of the game program or acquired video-audio data to a display apparatus such as a television set.

An insertion slot 52c into which an optical disk is to be inserted is provided on a front face of the electronic apparatus 1 (refer to FIG. 2). Further, on the front face of the electronic apparatus 1, a connector 7 for connecting a game controller, an external apparatus or the like is provided. In the example of FIG. 2, two connectors 7 are provided on the front face. It is to be noted that the insertion slot 52c and the connectors 7 may not necessarily be provided. As depicted in FIG. 3, the electronic apparatus 1 has a circuit board 2 on which integrated circuits such as a CPU and a memory are mounted, a cooling fan 3 for sucking external air, a power supply unit (not depicted) and so forth. The integrated circuits on the circuit board 2 and the power supply unit are cooled by an air flow formed by the cooling fan 3.

The external form of the electronic apparatus 1 generally has a shape of a parallelepiped having six faces each of which has a quadrangular shape and each two opposing ones of which extend substantially in parallel to each other. In particular, the upper face and the bottom face of the electronic apparatus 1 extend substantially in parallel to each other; also the front face and a rear face extend substantially in parallel to each other; and also left and right side faces extend substantially in parallel to each other. The left and right side faces are flat. Therefore, the electronic apparatus 1 can be selectively set to horizontal placement in which the bottom face is positioned on the lower side and vertical placement in which a side face is positioned on the lower side. The electronic apparatus 1 of the example described herein has a substantially parallelogrammic shape as viewed in side elevation (refer to FIG. 4). The other faces of the electronic apparatus 1 individually have a substantially rectangular shape.

The electronic apparatus 1 has the lower cover 20 and the upper cover 30 which configure the outer profile. In the example described here, the upper cover 30 includes a right upper cover 30R and a left upper cover 30L, which can be separated from each other in the leftward and rightward direction (refer to FIG. 5). The electronic apparatus 1 includes the frame 50 to which various parts and devices built in the electronic apparatus 1 such as the circuit board 2 and the cooling fan 3 are attached (refer to FIG. 5). The lower cover 20 covers the lower side of the frame 50 and is attached to the frame 50. The upper cover 30 covers the upper side of the frame 50 and is attached to the frame 50. The frame 50 defines a space in which the devices built in the electronic apparatus 1 are disposed. For example, the cooling fan 3 is disposed in a space S1. Meanwhile, an optical disk drive is disposed on the rear side of the insertion slot 52c, and the frame 50 covers the optical disk drive. The frame 50 is molded, for example, from a resin.

As depicted in FIG. 1, a plurality of vent holes h for communicating the inside and the outside of the electronic apparatus 1 with each other therethrough are provided on a side face of the electronic apparatus 1. The vent holes h of the example described here are holes for taking in air therethrough. When the cooling fan 3 is driven, air is sucked into the inside of the electronic apparatus 1 through the vent holes h. A groove a1 is formed on the side face of the electronic apparatus 1 such that it extends in the forward and rearward direction. In the example described here, a single groove a1 is formed on the side face. The groove a1 passes the center of the side face in the upward and downward direction and extends substantially in parallel to the upper face and the bottom face of the electronic apparatus 1.

The plurality of vent holes h are formed on an inner face of the groove a1 and are juxtaposed in an extension direction of the groove a1 (in the forward and rearward direction). All or most part of the plurality of vent holes h formed on the side face are positioned in the groove a1. In other words, the positions of the plurality of vent holes h are concentrated in the groove a1. In the example of FIG. 1, all of the plurality of vent holes h are formed on the inner face of the groove a1 while no vent hole h is formed at the other portion of the side face. By the configuration just described, even where the electronic apparatus 1 is placed vertically, the vent holes h are not closed up, and therefore, a drop of the suction efficiency in the vertical placement of the electronic apparatus 1 can be suppressed. The groove a1 and the vent holes h are formed on both of the left and right side faces of the electronic apparatus 1. The vent holes h may otherwise be formed only on one of the side faces.

As depicted in FIG. 1, the groove a1 extends to a front edge b1 of the side face of the electronic apparatus 1. The groove a1 is open forwardly at a front end thereof. Further, the groove a1 extends to a rear edge c1 of the side face of the electronic apparatus 1. The groove a1 is open rearwardly at a rear end thereof. With the structure just described, when the electronic apparatus 1 is placed vertically, air flows into the groove a1 through the front end and the rear end of the groove a1. This air is sucked into the electronic apparatus 1 through the vent holes h.

As depicted in FIG. 4, the front face and the rear face of the electronic apparatus 1 are inclined with respect to a vertical plane. In particular, the front face extends upwardly from the bottom face and is inclined to the rear side. The rear face extends upwardly from the bottom face and is inclined to the rear side. Therefore, even where the electronic apparatus 1 is accommodated at a small place on a rack or the like, a space is formed on the front side of the front face and the rear side of the rear face. As a result, a flow of air which is to flow into the groove a1 through the front end and the rear end of the groove a1 can be smoothened.

As depicted in FIG. 6, the frame 50 has a side wall portion 51 extending along the side face of the electronic apparatus 1. Projecting portions 51a and 51b are formed on the side wall portion 51 such that they project sidewardly and are opposed to each other in the upward and downward direction. The projecting portions 51a and 51b extend in the forward and rearward direction. The groove a1 is configured from the side wall portion 51 and the projecting portions 51a and 51b. The vent holes h are formed in the projecting portions 51a and 51b. The vent holes h are not formed in the side wall portion 51.

In other words, the inner face of the groove a1 has two faces opposing to each other in the upward and downward direction. In particular, the groove a1 has a first face formed from the projecting portion 51a and a second face formed from the projecting portion 51b. The inner face of the groove a1 further has a third face (face formed from the side wall portion 51) which connects the first face and the second face to each other. The vent holes h are formed in the first face and the second face. With the structure just described, the vent holes h can be suppressed from standing out in an appearance of the electronic apparatus 1. The vent holes h may be formed only in one of the projecting portion 51a (first face) on the lower side and the projecting portion 51b (second face) on the upper side.

On an end edge of the projecting portions 51a and 51b described above, attachment wall portions 51c and 51d are respectively formed such that they extend in the forward and rearward direction. The attachment wall portion 51c projects to the opposite side (lower side) to the groove a1 with respect to the projecting portion 51a. Similarly, the attachment wall portion 51d projects to the opposite side (upper side) to the groove a1 with respect to the projecting portion 51b. The lower cover 20 has a bottom face portion 21 which configures the bottom face of the electronic apparatus 1, and a side face portion 22 which configures the side face of the electronic apparatus 1. No vent hole is formed in the side face portion 22, and the side face portion 22 has a flat outer face. The projecting portion 51a and the attachment wall portion 51c are disposed on the inner side of the bottom face portion 21 and the side face portion 22 of the lower cover 20. The side face portion 22 is disposed along the attachment wall portion 51c and is attached to the attachment wall portion 51c through a plurality of engaging portions 22a formed on an inner face of the side face portion 22 and juxtaposed in the forward and rearward direction. In the example of FIG. 6, the engaging portions 22a are protrusions. A plurality of holes or recesses are formed on the attachment wall portion 51c. The engaging portions 22a are fitted in the holes or recesses formed on the attachment wall portion 51c.

The upper cover 30 has an upper face portion 31 which configures the upper face of the electronic apparatus 1 and a side face portion 32 which configures the side face of the electronic apparatus 1. No vent hole is formed in the side face portion 32, and the side face portion 32 has a flat outer face. The projecting portion 51b and the attachment wall portion 51d are disposed on the inner side of the upper face portion 31 and the side face portion 32. The side face portion 32 is disposed along the attachment wall portion 51d and attached to the attachment wall portion 51d through a plurality of engaging portions 32a formed on an inner face of the side face portion 32. In the example of FIG. 6, the engaging portions 32a are protrusions. The attachment wall portion 51d has a plurality of holes or recesses formed thereon. The engaging portions 32a are fitted in the holes or recesses formed on the attachment wall portion 51d.

The structure of the groove a1 is not limited to that described hereinabove. For example, the projecting portion 51a may be formed integrally with the lower cover 20 and the projecting portion 51b may be formed integrally with the upper cover 30.

As depicted in FIG. 6, the projecting portion 51a has a wall portion 51e which partitions two adjacent ones of the vent holes h. The wall portion 51e is directed in a direction orthogonal to the upward and downward direction. In the example described here, the wall portion 51e is disposed obliquely with respect to the forward and rearward direction. The vertical dimension of the wall portion 51e is set so that the inside of the electronic apparatus 1 may not be exposed to the outside.

The electronic apparatus 1 has a groove a2 formed on the front face thereof such that it extends in the leftward and rightward direction. The groove a2 passes the center of the front face in the upward and downward direction. As described hereinabove, the insertion slot 52c and the connectors 7 are provided on the front face. The insertion slot 52c and the connectors 7 are positioned in the groove a2 and juxtaposed in the leftward and rightward direction. Consequently, the insertion slot 52c and the connectors 7 become less likely to stand out in an appearance of the electronic apparatus 1. Further, dust can be suppressed from entering the connectors 7 or the insertion slot 52c. The groove a2 extends from a right end to a left end of the front face. The groove a2 is connected at end portions thereof to the grooves a1 formed on the side faces.

As depicted in FIG. 7, the frame 50 has a front wall portion 52 disposed along the front face of the electronic apparatus 1. The front wall portion 52 has apertures for exposing the connectors 7 therethrough and the insertion slot 52c formed therein. The lower cover 20 has a front face portion 23 which extends upwardly from a front edge of the bottom face portion 21 and configures the front face of the electronic apparatus 1. The front face portion 23 is positioned on the front side with respect to the front wall portion 52. A projecting portion 23a is formed at an upper edge of the front face portion 23 and extends toward the front wall portion 52. The upper cover 30 has a front face portion 33 which extends downwardly from a front edge of the upper face portion 31 and configures the front face of the electronic apparatus 1. The front face portion 33 is positioned on the front side with respect to the front wall portion 52. A projecting portion 33a is formed also at a lower edge of the front face portion 33 and extends toward the front wall portion 52. The projecting portions 23a and 33a are opposed to each other in the upward and downward direction. The groove a2 is defined by the projecting portions 23a and 33a and the front wall portion 52. In particular, an inner face of the groove a2 has a first face and a second face opposing to each other in the upward and downward direction and a third face which connects the first face and the second face to each other similarly to the groove a1. The first face and the second face are formed from the projecting portions 23a and 33a, respectively, and the third face is formed from the front wall portion 52. The insertion slot 52c and the apertures for exposing the connectors 7 to the outside are formed on the third face of the groove a2. The front face portion 23 of the example described here is inclined to the rear side. Further, the front face portion 33 extends downwardly and is inclined to the front side. The front face portions 23 and 33 are positioned on the opposite sides to each other across the groove a2 and configure the same plane.

Clearances C which function as vent holes (in the example described here, holes for sucking air therethrough) are formed between edges of the projecting portions 23a and 33a and the front wall portion 52. When the cooling fan 3 is driven, air is sucked in through the clearances C. In other words, vent holes are provided not only in the inner face of the groove a1 but also in the inner face of the groove a2.

A plurality of ribs 52a and 52b for assuring the clearances C are formed on the front wall portion 52. The ribs 52a project from the front wall portion 52 toward the front face portion 23 and the bottom face portion 21. The ribs 52b project from the front wall portion 52 toward the front face portion 33.

The front wall portion 52 extends upwardly farther than the position of the projecting portion 33a. Further, the front wall portion 52 extends downwardly farther than the position of the projecting portion 23a. Therefore, the inside of the electronic apparatus 1 can be prevented from being exposed through the clearances C. It is to be noted that the clearances C need not necessarily be provided. In this case, the projecting portions 23a and 33a may be formed on the front wall portion 52.

As depicted in FIG. 9, the projecting portion 23a formed on the front face portion 23 of the lower cover 20 extends to an upper edge of a front end of the side face portion 22. In particular, an end portion 23b of the projecting portion 23a is provided at the corner between the upper edge of the side face portion 22 and the upper edge of the front face portion 23. The end portion 23b of the projecting portion 23a extends from the corner toward the frame 50. Further, the lower cover 20 in the present example has a rear face portion 24 as hereinafter described in detail. A projecting portion 24a is formed also on an upper edge of the rear face portion 24. The projecting portion 24a extends to an upper edge of a rear end of the side face portion 22, and an end portion 24d of the projecting portion 24a is provided at the corner between the upper edge of the side face portion 22 and the upper edge of the rear face portion 24. In other words, a projecting portion is provided at each of the four corners of an upper edge of the lower cover 20. The projecting portions at the four corners surround the frame 50 as a whole. The projecting portions provided at the corners configure the first face of the groove a1 together with the projecting portion 51a of the frame 50. With the structure just described, even where a gap is generated at a corner between the lower cover 20 and the frame 50, the gap is less likely to stand out, and therefore, a good appearance can be assured readily. Further, the rigidity of the front face portion 23, the side face portion 22 and the rear face portion 24 can be assured readily.

Also the upper cover 30 has a projecting portion at each of the corners thereof similarly to the lower cover 20. In particular, as depicted in FIG. 10, the projecting portion 33a of the front face portion 33 extends to a lower edge of a front end of the side face portion 32. More particularly, an end portion 33b of the projecting portion 33a is provided at the corner between the lower edge of the side face portion 32 and the lower edge of the front face portion 33. Further, as hereinafter described in detail, the upper cover 30 has a rear face portion 34. A projecting portion 34*a* is formed also on a lower edge of the rear face portion 34. The projecting portion 34*a* extends to a lower edge of a rear end of the side face portion 32, and an end portion 34*d* of the projecting portion 34*a* is provided at the corner between the lower edge of the side face portion 32 and the lower edge of the rear face portion 34. In other words, a projecting portion is provided at each of the four corners of a lower edge of the upper cover 30. The projecting portions provided at the corners configure the second face of the groove a1 together with the projecting portion 51*b* of the frame 50. With the structure just described, even when a gap is generated at a corner between the upper cover 30 and the frame 50, the gap is less likely to stand out, and therefore, a good appearance can be assured readily. Further, the rigidity of the front face portion 33, the side face portion 32 and the rear face portion 34 can be assured readily.

As depicted in FIG. 1, buttons 9*a* and 9*b* are provided on the front face of the electronic apparatus 1. One of the buttons 9*a* and 9*b* is, for example, a power supply button, and the other one of the buttons 9*a* and 9*b* is, for example, an eject button for an optical disk. The button 9*a* is positioned on the lower side of the groove a2 while the button 9*b* is positioned on the upper side of the groove a2. The buttons 9*a* and 9*b* do not project forwardly from the front face of the electronic apparatus 1. In particular, front faces of the buttons 9*a* and 9*b* are positioned on a plane same as the plane configured from the front face portions 23 and 33 or a little rearwardly from the plane configured from the front face portions 23 and 33. As described hereinabove, the front face of the electronic apparatus 1 is inclined to the rear side. Therefore, the buttons 9*a* and 9*b* can be suppressed from becoming a blind spot. For example, even in a case in which the electronic apparatus 1 is placed vertically and the bottom face of the electronic apparatus 1 rests on an interior face of a rack, since the front face of the electronic apparatus 1 is inclined, the user can see the buttons 9*a* and 9*b*.

A groove is formed on the front face portion 23 of the lower cover 20 such that it extends in the upward and downward direction. The button 9*a* is a vertically elongated member and is disposed in the groove of the front face portion 23. Another groove is formed also on the front face portion 33 of the upper cover 30 such that it extends in the upward and downward direction. The button 9*b* is a vertically elongated member and is disposed in the groove of the front face portion 33. The groove of the front face portion 33 is positioned on an extension of the groove of the front face portion 23. In other words, the position of the groove of the lower cover 20 in the leftward and rightward direction and the position of the groove of the upper cover 30 in the leftward and rightward direction coincide with each other.

As described hereinabove, the upper cover 30 includes the left upper cover 30L and the right upper cover 30R which can be separated from each other in the leftward and rightward direction. In the example of FIG. 5, engaging portions 31*c* and 31*d* are formed on a right edge of the left upper cover 30L and a left edge of the right upper cover 30R, respectively, such that the engaging portions 31*c* and 31*d* engage with each other. For example, one of the engaging portions 31*c* and 31*d* has a spring portion which is caught by the other engaging portion.

A groove is formed between the left upper cover 30L and the right upper cover 30R in a coupled state. In particular, the groove described above in which the button 9*b* is disposed is formed between a front face portion 33L of the left upper cover 30L and a front face portion 33R of the right upper cover. A groove a4 (FIG. 1) is formed between an upper face portion 31L of the left upper cover 30L and an upper face portion 31R of the right upper cover 30R such that it extends in the forward and rearward direction. The groove between the upper face portions 31L and 31R extend from a front edge to a rear edge of the upper face portions 31L and 31R. The groove a4 is connected at a front end thereof to the groove between the front face portions 33L and 33R. An indicator for indicating an operation state of the electronic apparatus 1 (for example, an on/off state of the power supply) may be provided in the groove a4 between the upper face portions 31L and 31R. In particular, a light emitting element which emits light of a color representative of an operation state of the electronic apparatus 1 may be provided in the groove a4 between the upper face portions 31L and 31R.

In the example described here, the grooves described above which are provided on the front face and the upper face of the electronic apparatus 1 further extend to the back face and the bottom face and surround the overall electronic apparatus 1. In particular, a groove a5 is formed on the bottom face portion 21 of the lower cover 20 such that it extends in the forward and rearward direction as depicted in FIG. 8. The groove a5 of the bottom face portion 21 is connected at a front end thereof to the groove in which the button 9*a* is disposed. On the rear face portion 24 of the lower cover 20 hereinafter described, a groove a6 is formed such that it extends from the groove a5 of the bottom face portion 21. Further, on the rear face portion 34 of the upper cover 30 hereinafter described, a groove a7 is formed such that it extends from the groove a4 of the upper face portion 31.

As depicted in FIG. 8, supporting portions 21*c* are provided at the front end and a rear end of the groove of the bottom face portion 21 of the lower cover 20 such that they project a little from the bottom face portion 21. When the electronic apparatus 1 is placed horizontally, the supporting portions 21*c* support the electronic apparatus 1. The supporting portions 21*c* each have a width corresponding to that of the groove a5. With the configuration just described, the supporting portions 21*c* are less likely to stand out. Further, on an edge on the right side or the left side of the bottom face portion 21 (in the example described here, on the right edge), a supporting portion 21*d* is provided such that it projects a little from the bottom face portion 21.

The electronic apparatus 1 has a part which can be replaced by the user. The electronic apparatus 1 has a hard disk drive 8 as an example of the part (refer to FIGS. 3 and 5). The hard disk drive 8 is disposed on the frame 50 and covered with the left upper cover 30L. As described hereinabove, the left upper cover 30L can be separated from the right upper cover 30R. The user can replace the hard disk drive 8 by removing the left upper cover 30L.

The left upper cover 30L configures four faces of the electronic apparatus 1. In particular, the left upper cover 30L includes the upper face portion 31L, a side face portion, the front face portion 33L and a rear face portion 34L as depicted in FIG. 1, and the face portions mentioned configure the upper face, the side face, the front face and the rear face of the electronic apparatus 1. Therefore, if the left upper cover 30L is removed, then the frame 50 is exposed over a wide area. Therefore, the workability in a replacement work of the hard disk drive 8 can be improved.

As depicted in FIG. 8, a plurality of connectors are provided on the back face of the electronic apparatus 1. A connector 6a is a power supply connector. Connectors 6b, 6c, 6d and 6e are, for example, an AV terminal, a communication terminal for the Ethernet (registered trademark) or the like, an AUX terminal for connecting an external apparatus and so forth. The connector 6a is provided at a lower side portion of the back face, and the connectors 6b, 6c, 6d and 6e are provided at an upper side portion of the back face. As described hereinabove, the rear face of the electronic apparatus 1 is inclined to the rear side. Therefore, external force can be prevented from acting upon an end portion of cables connected to the connectors 6b, 6c, 6d and 6e. The connectors 6a, 6b, 6c, 6d and 6e are disposed on one side in the leftward and rightward direction (in the example described here, on the right side) of the rear face. When the electronic apparatus 1 is placed vertically, it is disposed such that the one side comes to the lower side.

As hereinafter described, the lower cover 20 and the right upper cover 30R are attached to the frame 50 by screws on the rear face. Meanwhile, no screw is used for the attachment of the left upper cover 30L to the frame 50, and the left upper cover 30L can be removed by cancelling the engagement of the engaging portions 31c and 31d. In other words, the left upper cover 30L can be removed readily in comparison with the lower cover 20 and the right upper cover 30R. All of the connectors 6a, 6b, 6c, 6d and 6e are positioned on the inner side of the cover whose removal is comparatively difficult (on the inner side of the lower cover 20 and the right upper cover 30R).

A plurality of vent holes p are provided on the back face of the electronic apparatus 1 (in the example described here, the vent holes p are holes for discharging air therethrough). When the cooling fan 3 is driven, air is discharged through the vent holes p. As described hereinabove, the back face of the electronic apparatus 1 is inclined to the rear side. Therefore, even if the electronic apparatus 1 is accommodated at a comparatively narrow place such as a rack, since a space is formed on the rear side of the back face, the air discharging efficiency can be suppressed from dropping.

As depicted in FIG. 8, the lower cover 20 has the rear face portion 24 (refer to FIG. 9) which extends upwardly from a rear edge of the bottom face portion 21 and is inclined to the rear side. The upper cover 30 has the rear face portion 34 (refer to FIG. 10) which extends downwardly from a rear edge of the upper face portion 31 and is inclined to the front side. The frame 50 has a rear wall portion 53 (refer to FIG. 5) which is positioned on the inner side of the rear face portions 24 and 34 and disposed along the rear face portions 24 and 34. The vent holes p are formed in the rear wall portion 53 of the frame 50. Each two adjacent ones of the vent holes p are partitioned by a louver 53a. Apertures 24b and 34b (refer to FIGS. 9 and 10) for exposing the vent holes p or the connectors 6a, 6b, 6c, 6d and 6e therethrough are formed in the rear face portions 24 and 34 of the covers 20 and 30, respectively.

By providing the rear face portions 24 and 34 on the upper cover 30 and the lower cover 20, respectively, the rigidity of the upper cover 30 and the lower cover 20 can be increased. As depicted in FIG. 10, the projecting portion 34a is formed on the lower edge of the rear face portion 34 such that it extends toward the rear wall portion 53. As depicted in FIG. 9, the projecting portion 24a is formed on the upper edge of the rear face portion 24 such that it extends toward the rear wall portion 53. The projecting portion 24a of the rear face portion 34 and the projecting portion 24a of the rear face portion 24 are opposed to each other in the upward and downward direction. Consequently, on the back face of the electronic apparatus 1, a groove a3 (refer to FIG. 4) is formed from the two projecting portions 24a and 34a and the rear wall portion 53. In other words, an inner face of the groove a3 has a first face and a second face opposing to each other in the upward and downward direction and a third face which connects the first face and the second face to each other similarly to the groove a1. The first face and the second face are formed from the projecting portions 24a and 34a, respectively, and the third face is formed from the rear wall portion 53. The plurality of vent holes p are formed in the third face. The groove a3 is connected at left and right end portions thereof to the grooves a1 formed on the side faces. In other words, the series of grooves a1, a2 and a3 are formed on the overall periphery of the electronic apparatus 1. It is to be noted that the groove a3 on the back face may not necessarily be formed.

On the electronic apparatus 1, the vent holes h and p, the apertures for exposing the connectors 7 therethrough and the insertion slot 52c for a recording medium are formed. The holes and the apertures are formed on the inner face of the grooves a1, a2 and a3. Especially on the side faces and the front face of the electronic apparatus 1, the positions of the vent holes h, the apertures for exposing the connectors 7 and the insertion slot 52c for a recording medium are concentrated in the grooves a1 and a2. With the structure just described, it is easy to assure the rigidity of exterior members of the electronic apparatus 1 in comparison with an alternative structure wherein the positions of the holes and the apertures are dispersed on the outer face of the electronic apparatus 1. In the present example, the vent holes h, the apertures for exposing the connectors 7 and the insertion slot 52c for a recording medium are formed in the frame 50. Therefore, it is easy to assure the rigidity of the covers 20 and 30 which are exterior members. Further, the buttons 9a and 9b and the indicator are disposed in the grooves formed on the front face and the groove a4 formed on the upper face. In other words, also the buttons 9a and 9b and the indicator are consolidated in a comparatively small region. Therefore, the rigidity of the exterior members can be assured readily in comparison with an alternative structure wherein they are dispersed on the outer face of the electronic apparatus 1.

As depicted in FIG. 9, an aperture 24c into which a screw for fixing the lower cover 20 to the frame 50 is to be inserted is formed on the rear face portion 24 of the lower cover 20. As described hereinabove, the engaging portions 22a for attaching the lower cover 20 to the side wall portion 51 of the frame 50 are formed on the left and right side face portions 22 of the lower cover 20. An aperture 34c (refer to FIG. 8) into which a screw for fixing the right upper cover 30R to the frame 50 is to be inserted is formed in a rear face portion 34R of the right upper cover 30R. Also the engaging portions 31d provided on the left edge of the right upper cover 30R are attached to the frame 50 by a screw. Meanwhile, no screw is used for attachment of the left upper cover 30L to the frame 50. In particular, the left upper cover 30L is fixed by the engaging portions 31c which engage with the right upper cover 30R and the engaging portions 32a (refer to FIG. 6) formed on the side face portion of the left upper cover 30L. Therefore, the user can remove the left upper cover 30L by cancelling the engagement of the engaging portions 31c and the engaging portions 32a upon replacement of the hard disk drive 8.

As described above, with the electronic apparatus 1, the groove a1 is formed on a side face, and the plurality of vent holes h provided on the side face are formed in the groove a1. Therefore, also when the electronic apparatus is placed vertically, the vent holes h can be suppressed from being closed up, and therefore, a drop of the ventilation efficiency can be suppressed.

It is to be noted that the present invention is not limited to the electronic apparatus 1 described above but allows various alterations.

For example, in the groove a1 on the side face, a hole for discharging air therethrough may be provided as a vent hole.

The frame 50 may not necessarily be provided. In this case, the upper cover 30 and the lower cover 20 may be united with each other to configure a box-like housing.

The upper cover 30 may not necessarily be separated into the left upper cover 30L and the right upper cover 30R.

The electronic apparatus 1 may not necessarily have a parallelogrammic shape as viewed in side elevation. For example, the electronic apparatus 1 may have a substantially rectangular shape as viewed in side elevation.

The invention claimed is:

1. An electronic apparatus, comprising:
a plurality of vent holes provided on a side face of the electronic apparatus and configured to communicate an inside and an outside of the electronic apparatus with each other therethrough;
a fan configured to suck or discharge air through the plurality of vent holes;
a first groove formed on the side face and extending in a forward and rearward direction; the plurality of vent holes being formed on an inner face of the first groove of the side face;
a second groove is formed on a rear face of the electronic apparatus so as to extend in a leftward and rightward direction and connect at an end portion thereof to a rear end of the first groove;
a third groove is formed on a front face of the electronic apparatus so as to extend in a leftward and rightward direction; and
at least one of an aperture for exposing a connector therethrough and a vent hole is formed on an inner face of the second groove.

2. The electronic apparatus according to claim 1, wherein the third groove connects at an end portion thereof to a front end of the first groove; and
at least one of an aperture for exposing a connector therethrough and an insertion slot for a recording medium is formed on an inner face of the third groove.

3. The electronic apparatus according to claim 1, wherein the inner face of the first groove includes a first face and a second face opposing to each other in an upward and downward direction and a third face configured to connect the first face and the second face to each other; and
the plurality of vent holes are formed on at least one of the first face and the second face.

4. The electronic apparatus according to claim 1, wherein a front face of the electronic apparatus extends upwardly from a front edge of a bottom face and is inclined rearwardly.

5. The electronic apparatus according to claim 1, wherein a rear face of the electronic apparatus extends upwardly from a rear edge of a bottom face and is inclined rearwardly.

6. An electronic apparatus according, comprising:
a plurality of vent holes provided on a side face of the electronic apparatus and configured to communicate an inside and an outside of the electronic apparatus with each other therethrough;
a fan configured to suck or discharge air through the plurality of vent holes;
a first groove formed on the side face and extending in a forward and rearward direction; the plurality of vent holes being formed on an inner face of the first groove of the side face;
a second groove is formed on a from face and an upper face of the electronic apparatus so as to extend in the forward and rearward direction;
a third groove is formed on the front face of the electronic apparatus so as to extend in a leftward and rightward direction; and
a button is disposed in the second groove.

7. The electronic apparatus according to claim 6, wherein the inner face of the first groove includes a first face and a second face opposing to each other in an upward and downward direction and a third face configured to connect the first face and the second face to each other; and
the plurality of vent holes are formed on at least one of the first face and the second face.

8. The electronic apparatus according to claim 6, wherein the front face of the electronic apparatus extends upwardly from a front edge of a bottom face and is inclined rearwardly.

9. The electronic apparatus according to claim 6, wherein a rear face of the electronic apparatus extends upwardly from a rear edge of a bottom face and is inclined rearwardly.

10. An electronic apparatus, comprising:
a plurality of vent holes provided on a side face of the electronic apparatus and configured to communicate an inside and an outside of the electronic apparatus with each other therethrough;
a fan configured to suck or discharge air through the plurality of vent holes;
a front face of the electronic apparatus extends upwardly from a front edge of a bottom face and is inclined rearwardly; and
a first groove formed on the side face and extending in a forward and rearward direction; wherein
the plurality of vent holes being formed on an inner face of the first groove of the side face, and
the first groove extends to a front edge of the side face and is open forwardly at a front end thereof.

11. The electronic apparatus according to claim 10, wherein
a second groove is formed on a front face of the electronic apparatus so as to extend in a leftward and rightward direction and connect at an end portion thereof to a front end of the first groove; and
at least one of an aperture for exposing a connector therethrough and an insertion slot for a recording medium is formed on an inner face of the second groove.

12. The electronic apparatus according to claim 10, wherein
the inner face of the first groove includes a first face and a second face opposing to each other in an upward and downward direction and a third face configured to connect the first face and the second face to each other; and
the plurality of vent holes are formed on at least one of the first face and the second face.

13. An electronic apparatus, comprising:
a plurality of vent holes provided on a side face of the electronic apparatus and configured to communicate an inside and an outside of the electronic apparatus with each other therethrough;

a fan configured to suck or discharge air through the plurality of vent holes;

a rear face of the electronic apparatus extends upwardly from a rear edge of a bottom face and is inclined rearwardly; and a first groove formed on the side face and extending in a forward and rearward direction, wherein the plurality of vent holes being formed on an inner face of the first groove of the side face, and the first groove extends to a rear edge of the side face and is open rearwardly at a rear end thereof.

14. The electronic apparatus according to claim 13, wherein a second groove is formed on a rear face of the electronic apparatus so as to extend in a leftward and rightward direction and connect at an end portion thereof to a rear end of the first groove; and at least one of an aperture for exposing a connector therethrough and a vent hole is formed on an inner face of the second groove.

15. The electronic apparatus according to claim 13, wherein the inner face of the first groove includes a first face and a second face opposing to each other in an upward and downward direction and a third face configured to connect the first face and the second face to each other; and the plurality of vent holes are formed on at least one of the first face and the second face.

* * * * *